(12) United States Patent
Goto et al.

(10) Patent No.: US 12,744,509 B2
(45) Date of Patent: Sep. 22, 2026

(54) MULTILAYER PIEZOELECTRIC SUBSTRATE DEVICE WITH POLYCRYSTALLINE SUBSTRATE

(71) Applicant: SKYWORKS SOLUTIONS, INC., Irvine, CA (US)

(72) Inventors: Rei Goto, Osaka (JP); Hironori Fukuhara, Ibaraki (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 1077 days.

(21) Appl. No.: 17/886,725

(22) Filed: Aug. 12, 2022

(65) Prior Publication Data

US 2023/0055758 A1 Feb. 23, 2023

Related U.S. Application Data

(60) Provisional application No. 63/233,840, filed on Aug. 17, 2021.

(51) Int. Cl.

*H03H 9/02* (2006.01)
*H03H 3/08* (2006.01)
*H03H 9/25* (2006.01)

(52) U.S. Cl.

CPC .......... *H03H 9/02866* (2013.01); *H03H 3/08* (2013.01); *H03H 9/25* (2013.01)

(58) Field of Classification Search

CPC ............................. H03H 9/02866; H03H 9/25
USPC ...... 310/313 R, 313 A, 313 B, 313 C, 313 D
See application file for complete search history.

(56) References Cited

U.S. PATENT DOCUMENTS

2015/0028720 A1* 1/2015 Kando .................. H10N 30/04 156/230
2021/0104999 A1* 4/2021 Geshi .................... H10N 30/06

* cited by examiner

*Primary Examiner* — Derek J Rosenau
(74) *Attorney, Agent, or Firm* — Lando & Anastasi, LLP

(57) ABSTRACT

A multilayer piezoelectric substrate for a surface acoustic wave resonator comprises a carrier substrate having an upper surface, a high acoustic velocity dielectric layer having a lower surface disposed on the upper surface of the carrier substrate and an upper surface to reflect acoustic energy generated by the surface acoustic wave resonator away from the carrier substrate, a low acoustic velocity dielectric layer having a lower surface disposed on the upper surface of the high acoustic velocity dielectric layer and an upper surface, the low acoustic velocity dielectric layer exhibiting a lower acoustic velocity than an acoustic velocity of the high acoustic velocity dielectric layer, and a layer of piezoelectric material having a lower surface disposed on the upper surface of the low acoustic velocity dielectric layer.

19 Claims, 16 Drawing Sheets

MULTILAYER PIEZOELECTRIC SUBSTRATE DEVICE WITH POLYCRYSTALLINE SUBSTRATE

CROSS-REFERENCE TO RELATED APPLICATIONS

This application claims priority under 35 U.S.C. § 119(e) to U.S. Provisional Patent Application Ser. No. 63/233,840, titled "MULTILAYER PIEZOELECTRIC SUBSTRATE DEVICE WITH POLYCRYSTALLINE SUBSTRATE," filed Aug. 17, 2021, the entire contents of which is incorporated herein in its entirety for all purposes.

BACKGROUND

Technical Field

Embodiments of this disclosure relate to acoustic wave devices having multilayer piezoelectric substrates, and to filters and electronic devices including same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front end of a mobile telephone can include acoustic wave filters. Two acoustic wave filters can be arranged as a duplexer or a diplexer.

SUMMARY

In accordance with one aspect, there is provided a multilayer piezoelectric substrate for a surface acoustic wave resonator. The multilayer piezoelectric substrate comprises a carrier substrate having an upper surface, a high acoustic velocity dielectric layer having a lower surface disposed on the upper surface of the carrier substrate and an upper surface to reflect acoustic energy generated by the surface acoustic wave resonator away from the carrier substrate, a low acoustic velocity dielectric layer having a lower surface disposed on the upper surface of the high acoustic velocity dielectric layer and an upper surface, the low acoustic velocity dielectric layer exhibiting a lower acoustic velocity than an acoustic velocity of the high acoustic velocity dielectric layer, and a layer of piezoelectric material having a lower surface disposed on the upper surface of the low acoustic velocity dielectric layer.

In some embodiments, the carrier substrate comprises a polycrystalline material.

In some embodiments, the carrier substrate comprises $Mg_2AlO_4$.

In some embodiments, the high acoustic velocity dielectric layer comprises silicon nitride.

In some embodiments, the high acoustic velocity dielectric layer further comprises silicon dioxide.

In some embodiments, the high acoustic velocity dielectric layer comprises a greater amount of silicon nitride than silicon dioxide.

In some embodiments, the low acoustic velocity dielectric layer comprises silicon dioxide.

In some embodiments, the high acoustic velocity dielectric layer comprises one of AlN or $Al_2O_3$.

In some embodiments, the high acoustic velocity dielectric layer is thicker than the low acoustic velocity dielectric layer.

In some embodiments, the high acoustic velocity dielectric layer is thicker than the layer of piezoelectric material.

In some embodiments, the high acoustic velocity dielectric layer has a thickness of at least 0.3λ, wherein λ is a wavelength of a main acoustic wave generated by the surface acoustic wave resonator.

In some embodiments, the high acoustic velocity dielectric layer is thicker than a combined thickness of the low acoustic velocity dielectric layer and the layer of piezoelectric material.

In some embodiments, the high acoustic velocity dielectric layer comprises one of silicon nitride, silicon oxynitride, aluminum nitride, alumina, quartz, or sapphire.

In some embodiments, the carrier substrate comprises a same material as the high acoustic velocity dielectric layer.

In some embodiments, the carrier substrate consists of the same material as the high acoustic velocity dielectric layer.

In some embodiments, the multilayer piezoelectric substrate is included in a surface acoustic wave resonator.

In some embodiments, the surface acoustic wave resonator is included in a filter.

In some embodiments, the filter is included in a radio frequency device module.

In some embodiments, the radio frequency device module is included in a radio frequency device.

In accordance with another aspect, there is provided a method of forming a surface acoustic wave resonator. The method comprises providing a carrier substrate having an upper surface, forming a high acoustic velocity dielectric layer having a lower surface on the upper surface of the carrier substrate, forming a low acoustic velocity dielectric layer having on an upper surface of the high acoustic velocity dielectric layer, the low acoustic velocity dielectric layer exhibiting a lower acoustic velocity than an acoustic velocity of the high acoustic velocity dielectric layer, forming a layer of piezoelectric material on an upper surface of the low acoustic velocity dielectric layer, and forming interdigital transducer electrodes on an upper surface of the layer of piezoelectric material.

In some embodiments, the method further comprises forming a radio frequency filter including the surface acoustic wave resonator.

In some embodiments, the method further comprises forming a radio frequency device module including the radio frequency filter.

In some embodiments, the method further comprises forming a radio frequency electronic device including the radio frequency device module.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
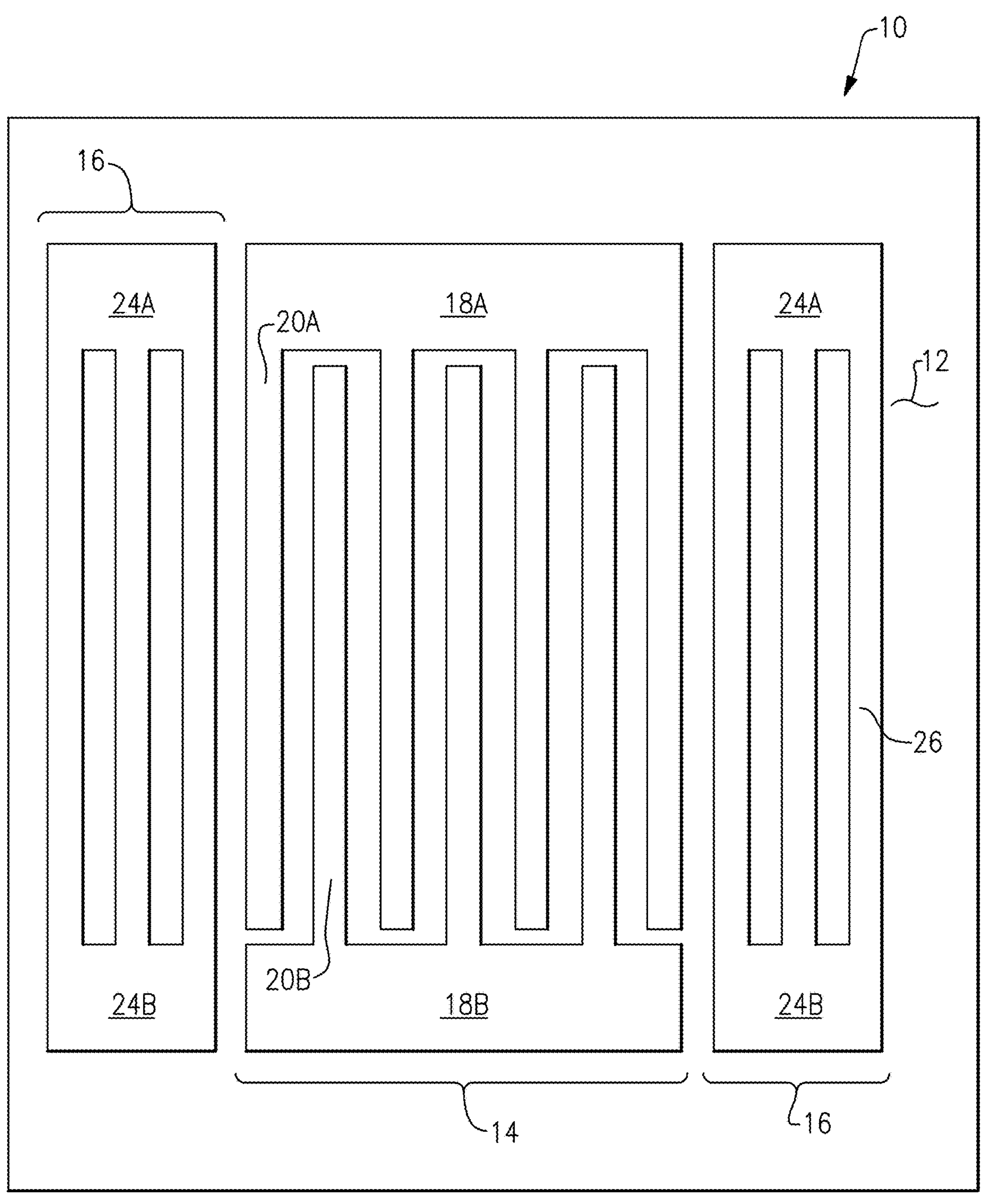
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, diplexer, balun, etc.

Acoustic wave resonator 10 is formed on a piezoelectric substrate, for example, a lithium tantalate ($LiTaO_3$) or lithium niobate ($LiNbO_3$) substrate 12 and includes interdigital transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first busbar electrode 18A and a second busbar electrode 18B facing first busbar electrode 18A. The busbar electrodes 18A, 18B may be referred to herein together as busbar electrode 18. The IDT electrodes 14 further include first electrode fingers 20A extending from the first busbar electrode 18A toward the second busbar electrode 18B, and second electrode fingers 20B extending from the second busbar electrode 18B toward the first busbar electrode 18A.

The reflector electrodes 16 (also referred to as reflector gratings) each include a first reflector busbar electrode 24A and a second reflector busbar electrode 24B (collectively referred to herein as reflector busbar electrode 24) and reflector fingers 26 extending between and electrically coupling the first busbar electrode 24A and the second busbar electrode 24B.

Figure 1B:
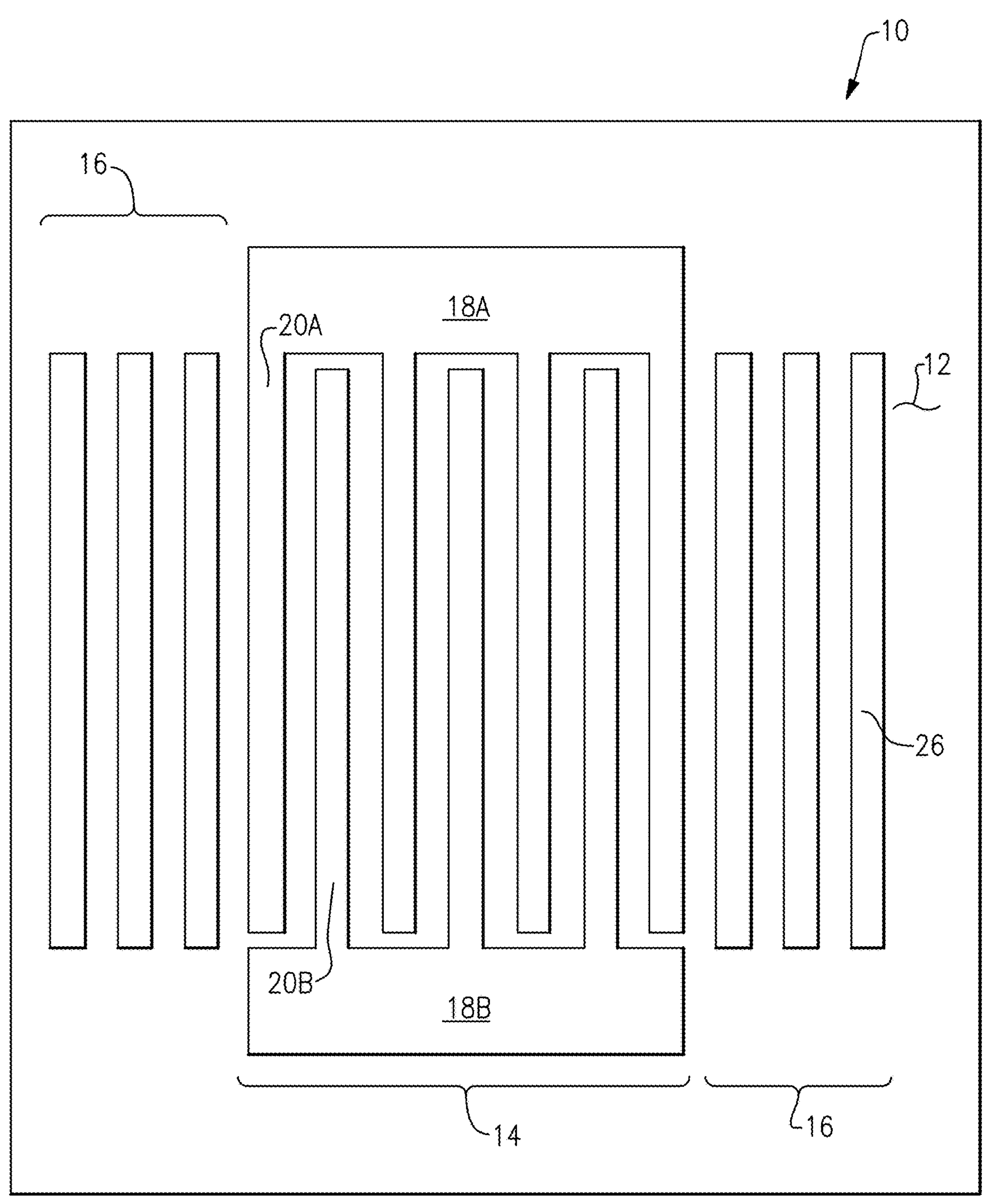
FIG. 1B is a simplified plan view of another example of a surface acoustic wave resonator.
Figure 1C:
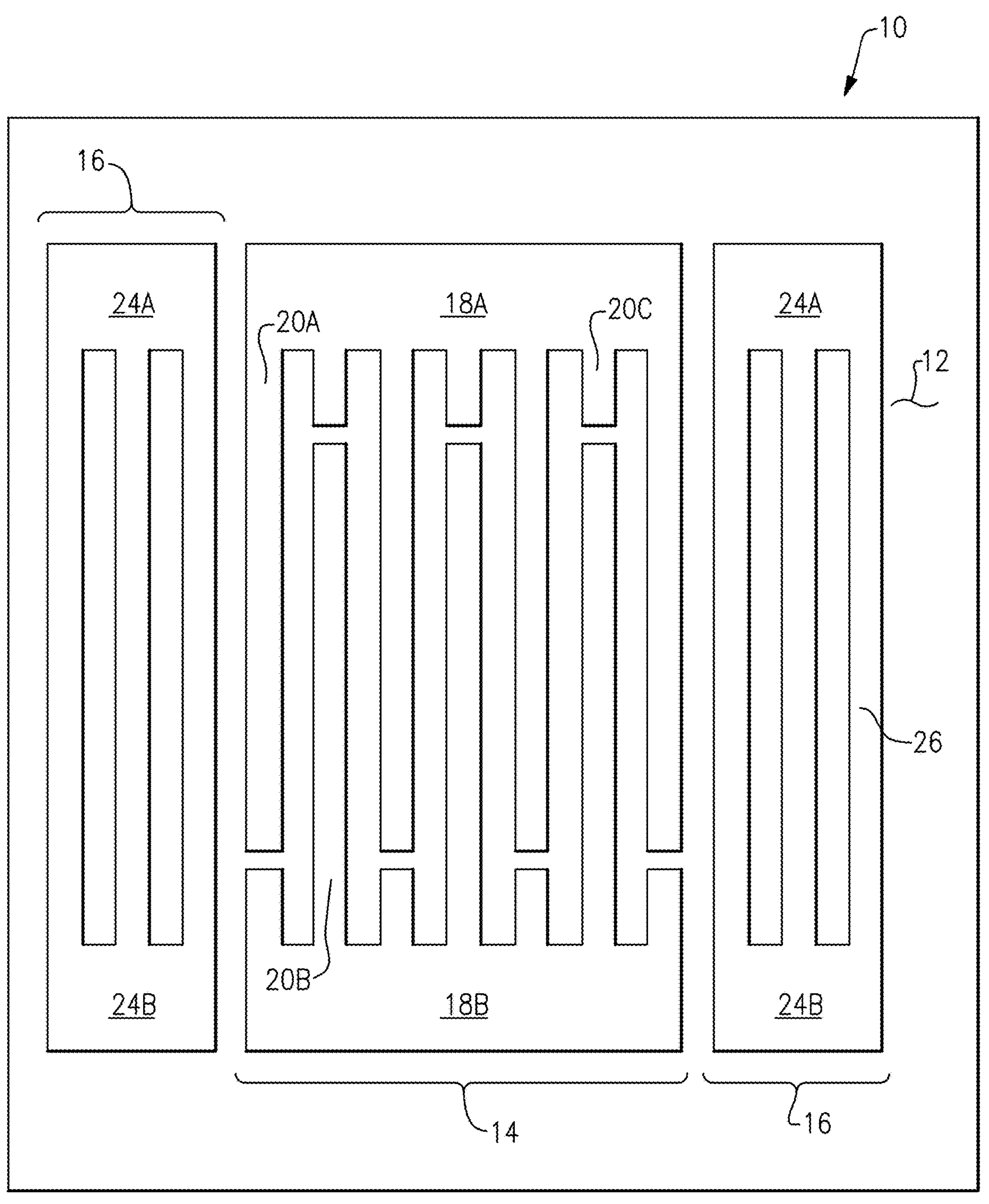
FIG. 1C is a simplified plan view of another example of a surface acoustic wave resonator.

In other embodiments disclosed herein, as illustrated in FIG. 1B, the reflector busbar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite busbar electrode 18A, 18B than the respective electrode finger 20A, 20B with which it is aligned.

Figure 2:
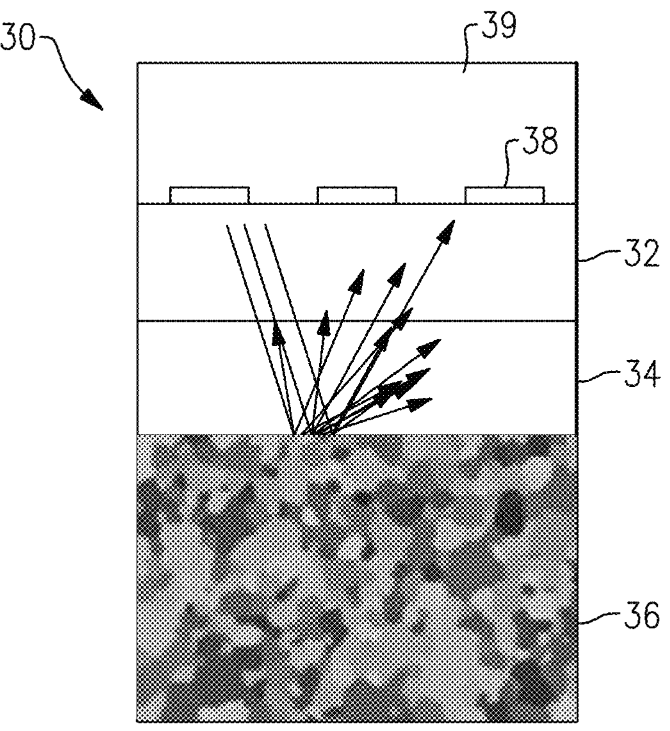
FIG. 2 is a cross-sectional view of a portion of a surface acoustic wave resonator having a first example of a multilayer piezoelectric substrate.

FIG. 2 is a partial cross-sectional view of an acoustic wave resonator 30 having a multilayer piezoelectric substrate including a layer 32 of piezoelectric material, for example, lithium tantalate or lithium niobate, a dielectric material layer 34, for example, silicon dioxide, on which the layer 32 of piezoelectric material is disposed, and a carrier substrate 36 on which the dielectric material layer 34 is disposed. IDT and reflector electrodes, indicated collectively at 38, having configurations such as illustrated in any of FIGS. 1A-1C may be disposed on the upper surface of the layer 32 of piezoelectric material. A temperature compensation layer 39, for example, a layer of $SiO_2$ may be disposed on top of the IDT electrodes 38 and the upper surface of the layer 32 of piezoelectric material. Any of the resonator structures disclosed herein may include a temperature compensation layer 39 as illustrated in FIG. 2, although this layer is not illustrated in the remaining figures of this disclosure. The carrier substrate 36 may be formed of a polycrystalline material, for example, spinel ($Mg_2AlO_4$). Advantages of forming an acoustic wave resonator 30 with a multiplayer piezoelectric substrate as illustrated in FIG. 2 is that the spinel material is less expensive than may other possible carrier substrate materials, for example, high purity silicon or sapphire. A disadvantage of forming an acoustic wave resonator 30 with a multiplayer piezoelectric substrate as illustrated in FIG. 2 is that the upper surface of the spinel carrier substrate 36 may scatter acoustic waves generated by the IDT electrodes in operation that propagate to the spinel carrier substrate 36, as illustrated by the arrows in FIG. 2, and cause the resonator to exhibit a lower quality factor Q than desirable due to acoustic detraction caused by the scattering of the acoustic waves. The resonator structure 30 of FIG. 2 will be referred to later in this disclosure as the "Baseline" structure.

Figure 3:
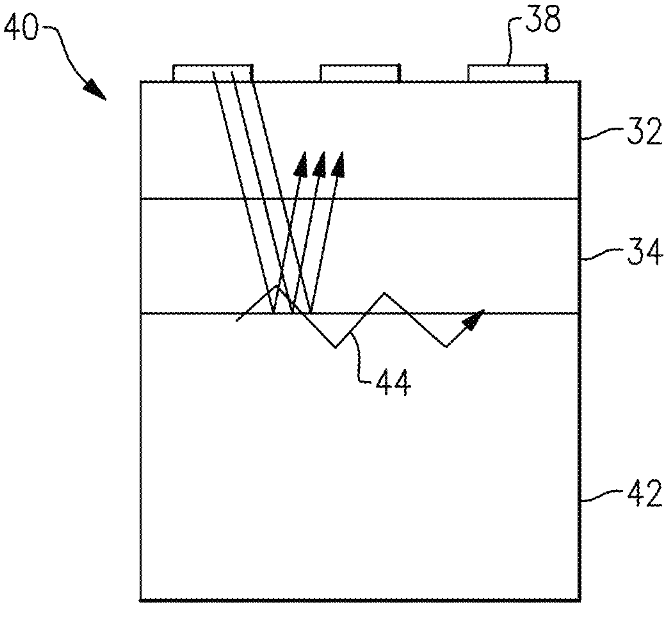
FIG. 3 is a cross-sectional view of a portion of a surface acoustic wave resonator having another example of a multilayer piezoelectric substrate.

Another example of an acoustic wave resonator 40 having a multilayer piezoelectric substrate is illustrated in partial cross-section in FIG. 3. The multilayer piezoelectric substrate of the acoustic wave resonator 40 includes a layer 32 of piezoelectric material, for example, lithium tantalate or lithium niobate, a dielectric material layer 34, for example, silicon dioxide, on which the layer 32 of piezoelectric material is disposed, and a carrier substrate 42 on which the dielectric material layer 34 is disposed. IDT and reflector electrodes, indicated collectively at 38, having configurations such as illustrated in any of FIGS. 1A-1C may be disposed on the upper surface of the layer 32 of piezoelectric material. The carrier substrate 42 may be formed of Si. Advantages of forming an acoustic wave resonator 30 with a multiplayer piezoelectric substrate as illustrated in FIG. 3 is that the Si material for the carrier substrate 42 is widely available and easily processed by techniques developed in the semiconductor industry. A disadvantage of forming an acoustic wave resonator 40 with a multiplayer piezoelectric substrate as illustrated in FIG. 3 is that an interface between the upper surface of the Si carrier substrate 42 and the lower surface of the dielectric material layer 34 may include parasitic surface charges that may cause the resonator to exhibit a lower quality factor Q than desirable due to losses caused by parasitic surface conductivity associated with the parasitic surface charges. This undesirable effect may be at least partially alleviated by forming a trap rich layer 44 in the upper portion of the Si carrier substrate 42, however, this involves additional processing steps which may be more expensive than desired. The resonator structure 40 of FIG. 3 will be referred to later in this disclosure as the "Baseline 2" structure.

Figure 4:
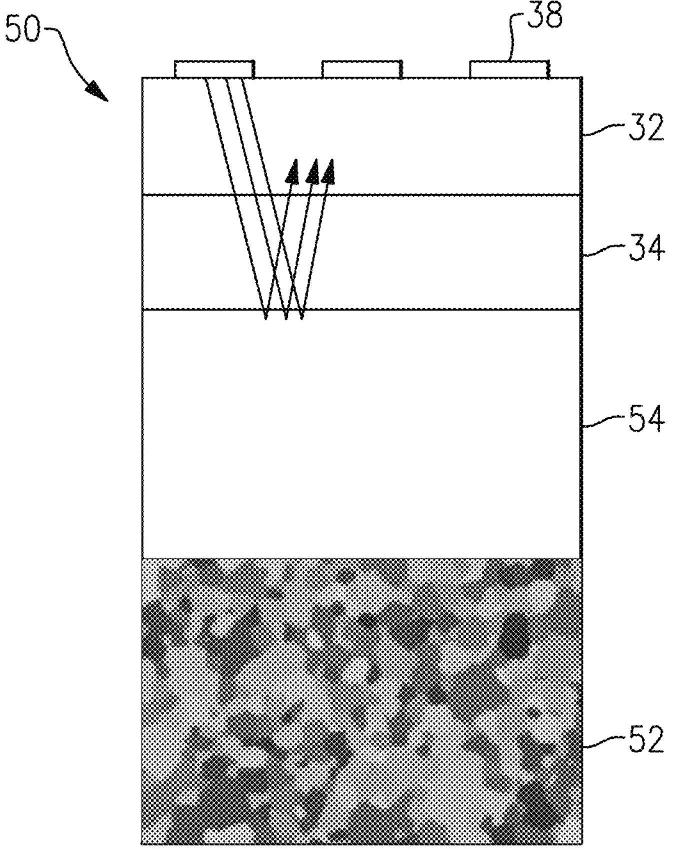
FIG. 4 is a cross-sectional view of a portion of a surface acoustic wave resonator having another example of a multilayer piezoelectric substrate.
Figure 5:
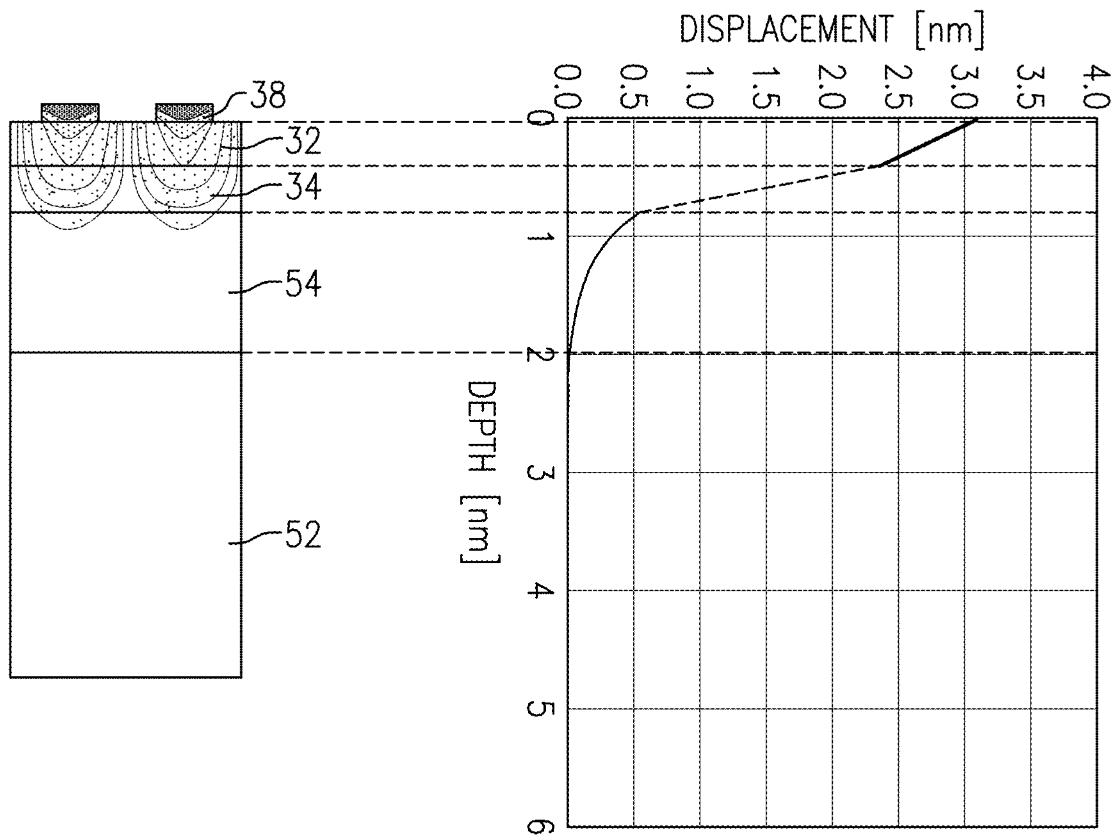
FIG. 5 illustrates results of simulation of displacement as a function of depth due to acoustic waves generated by interdigital transducer (IDT) electrodes in an example of a surface acoustic wave device.

Another example of an acoustic wave resonator 50 having a multilayer piezoelectric substrate is illustrated in partial cross-section in FIG. 4. The multilayer piezoelectric substrate of the acoustic wave resonator 50 includes a layer 32 of piezoelectric material, for example, lithium tantalate or lithium niobate, a dielectric material layer 34, for example, silicon dioxide, on which the layer 32 of piezoelectric material is disposed, and a high velocity layer 54 disposed beneath and in contact with the lower surface of the dielectric material layer 34. The high velocity layer 54 is formed of a material exhibiting a higher acoustic velocity than the acoustic velocity exhibited by the material of the dielectric material layer 34. The high velocity layer 54 may be formed of or include one or more of, for example, silicon nitride (SiN), silicon oxy-nitride (SiON), aluminum nitride (AlN), alumina ($Al_2O_3$), sapphire, quartz, or another material exhibiting a higher acoustic velocity than the acoustic velocity exhibited by the material of the dielectric material layer 34. A carrier substrate 52 is disposed beneath and in in contact with the lower surface of the high velocity layer 54. IDT and reflector electrodes, indicated collectively at 38, having configurations such as illustrated in any of FIGS. 1A-1C may be disposed on the upper surface of the layer 32 of piezoelectric material. The carrier substrate 52 may be formed of a polycrystalline material, for example, spinel ($Mg_2AlO_4$). Advantages of forming an acoustic wave resonator 50 with a multiplayer piezoelectric substrate as illustrated in FIG. 5 is that the high velocity layer 54 reflects most if not all of the acoustic waves generated by the IDT electrodes and travelling toward the carrier substrate 52, confining most of the acoustic energy generated by the IDT electrodes within the layer 32 of piezoelectric material and dielectric material layer 34. There is little, if any, quality factor degradation caused by the carrier substrate 52, such as in the embodiment of FIG. 2, because very little, if any acoustic energy in the form of acoustic waves generated by the IDT electrodes passes through the high velocity layer 54 and reaches the upper surface of the carrier substrate 52. Further, the spinel carrier substrate 52 does not exhibit parasitic surface charges that one might want to neutralize by forming a trap rich layer, as in the embodiment of FIG. 3. The resonator structure 50 of FIG. 4 will be referred to later in this disclosure as the "Proposed" structure.

A simulation was performed to evaluate displacement as a function of depth in an example of an acoustic wave resonator having a multilayer piezoelectric substrate structure such as illustrated in FIG. 4. The results of this simulation are shown in FIG. 5. As shown in the chart of FIG. 5, most of the acoustic displacement was confined to the layer 32 of piezoelectric material, dielectric material layer 34, and high velocity layer 54. Almost no acoustic displacement occurred in the carrier substrate 52. This indicates that the high velocity layer 54 was effective at reflecting acoustic energy produced from the IDT electrodes 38 and preventing this acoustic energy from reaching the carrier substrate 52 where the associated acoustic waves might otherwise have scattered and caused spurious signals in the performance characteristics of the resonator.

Figure 6A:
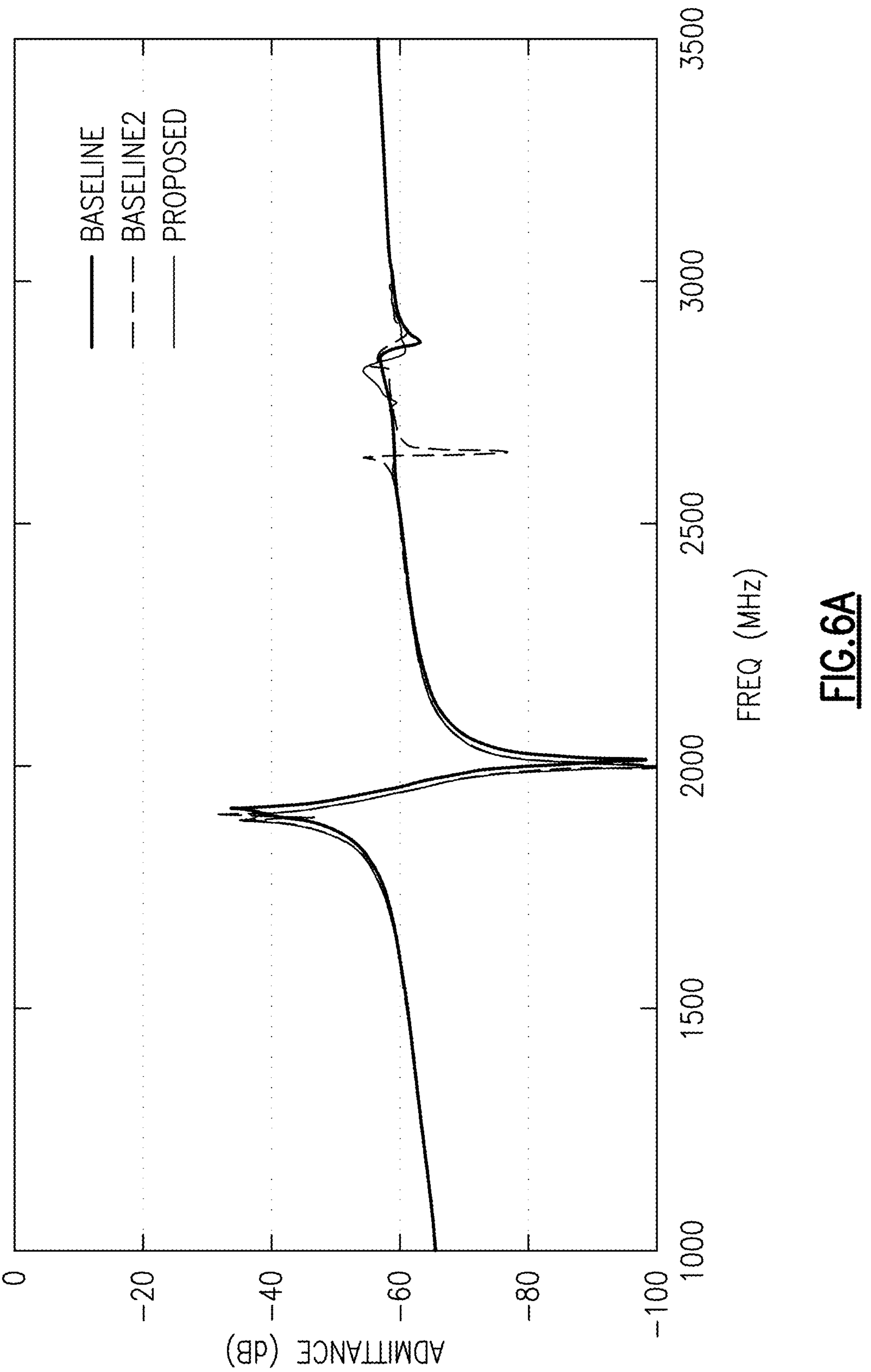
FIG. 6A illustrates results of a simulation of admittance for acoustic wave devices having different multilayer piezoelectric substrate structures.

Simulations were performed to evaluate the admittance and quality factor parameters as a function of frequency for examples of acoustic wave resonators having a multilayer piezoelectric substrate (MPS) structure such as illustrated in FIG. 2 ("Baseline" structure), FIG. 3 ("Baseline 2" structure), and FIG. 4 ("Proposed" structure). These results of these simulations are presented in FIGS. 6A (admittance v. frequency) and 6B (Q v. frequency). As illustrated in FIG. 6A, the three resonators with the different MPS types exhibited similar admittance characteristics about the resonance and antiresonance frequencies. The resonator with the "Baseline 2" MPS structure exhibited a strong high order spurious response at about 2.65 GHz, which, without wishing to be bound to a specific theory, may have been due to acoustic wave reflections from the interface between the carrier substrate 42 and dielectric layer 34 or due to the effects of parasitic surface conductivity at this interface. The resonators with the "Baseline" and "Proposed" MPS structures exhibited smaller spurious responses in their admittance curves at slightly higher frequencies of about 2.75-2.8 GHz.

Figure 6B:
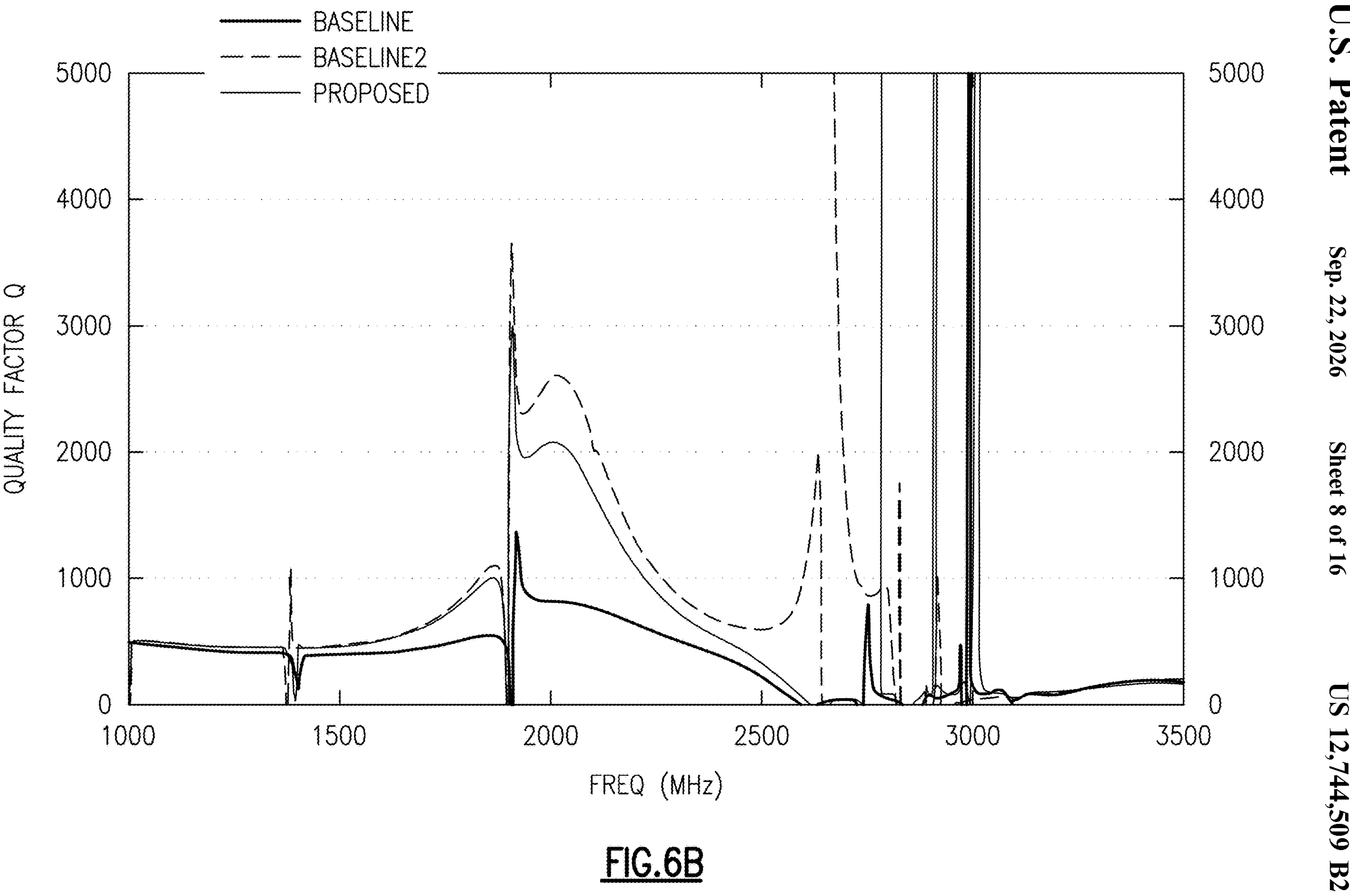
FIG. 6B illustrates results of a simulation of quality factor for acoustic wave devices having different multilayer piezoelectric substrate structures.

As illustrated in FIG. 6B, the resonator with the "Baseline 2" MPS structure exhibited the best quality factor at the antiresonance frequency of 2 GHz, but at the expense of the higher order spurious response illustrated in FIG. 6A. The resonator with the "Proposed" MPS structure exhibited an acceptable quality factor of about 2000 at the antiresonance frequency of 2 GHz. The resonator with the "Baseline" MPS structure exhibited the worst quality factor (<1000) at the antiresonance frequency of 2 GHz.

Figure 7A:
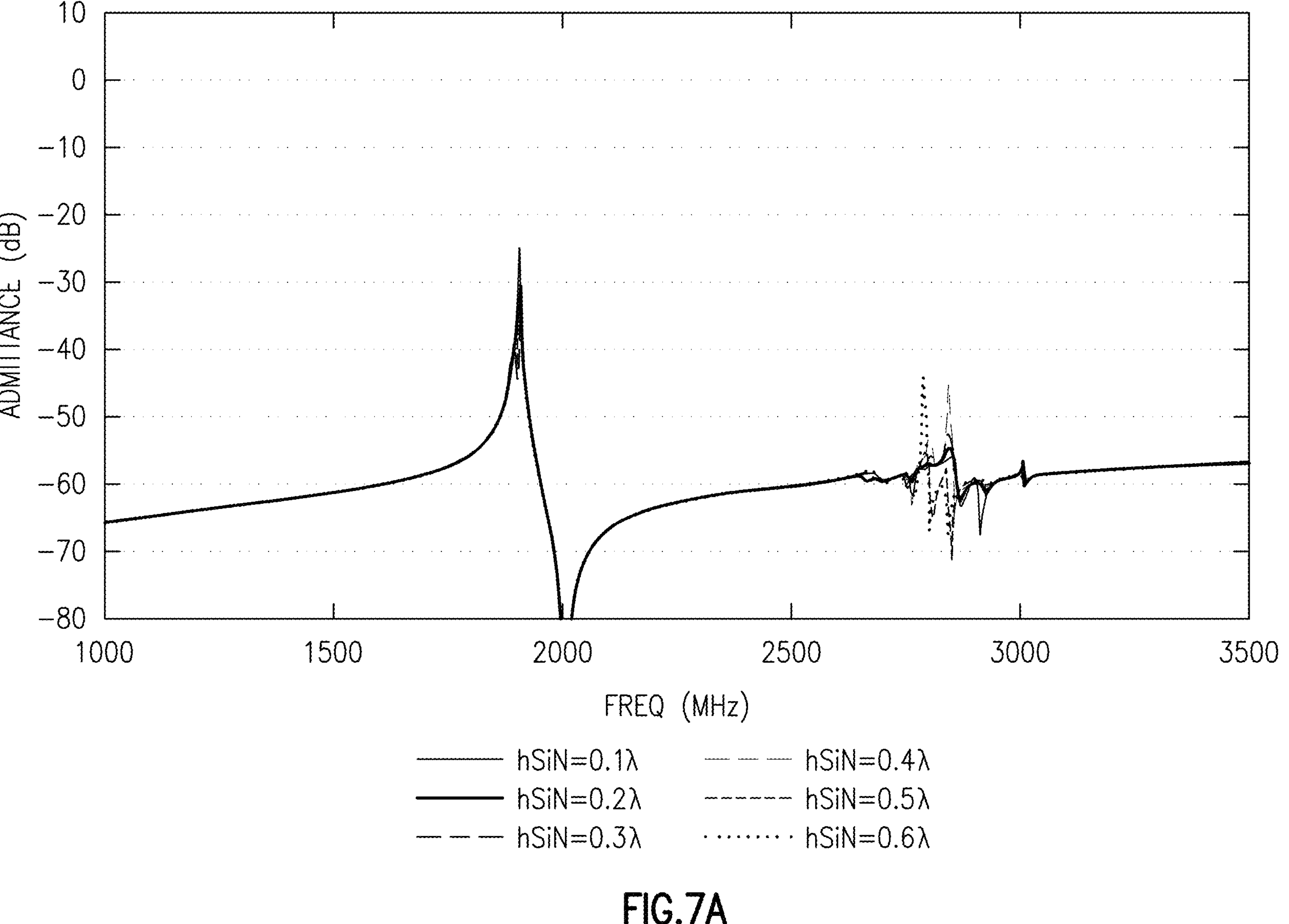
FIG. 7A illustrates results of a simulation of admittance for acoustic wave devices having different thicknesses of a high velocity layer in their multilayer piezoelectric substrate structures.
Figure 7B:
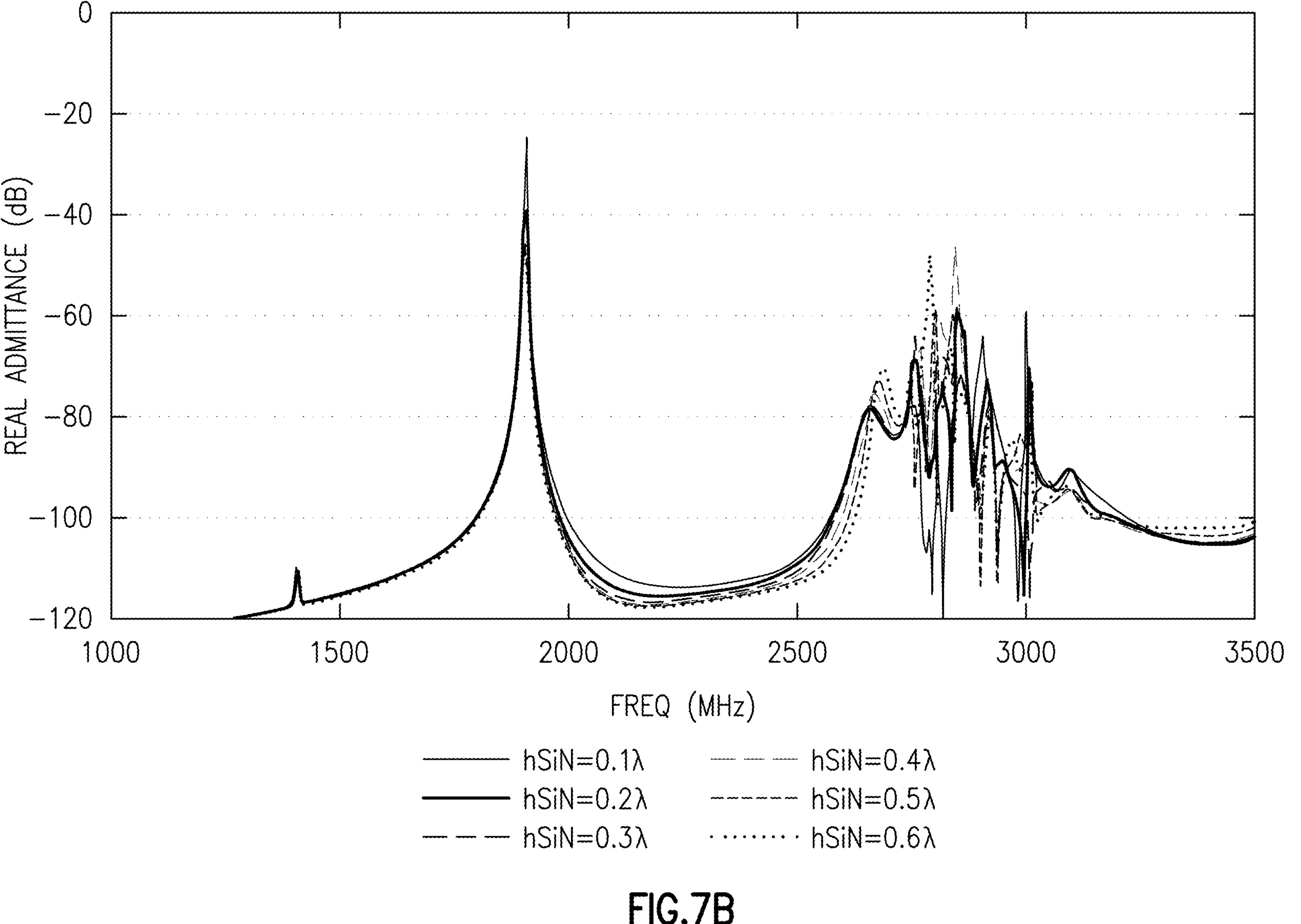
FIG. 7B illustrates results of a simulation of real admittance for acoustic wave devices having different thicknesses of a high velocity layer in their multilayer piezoelectric substrate structures.
Figure 7C:
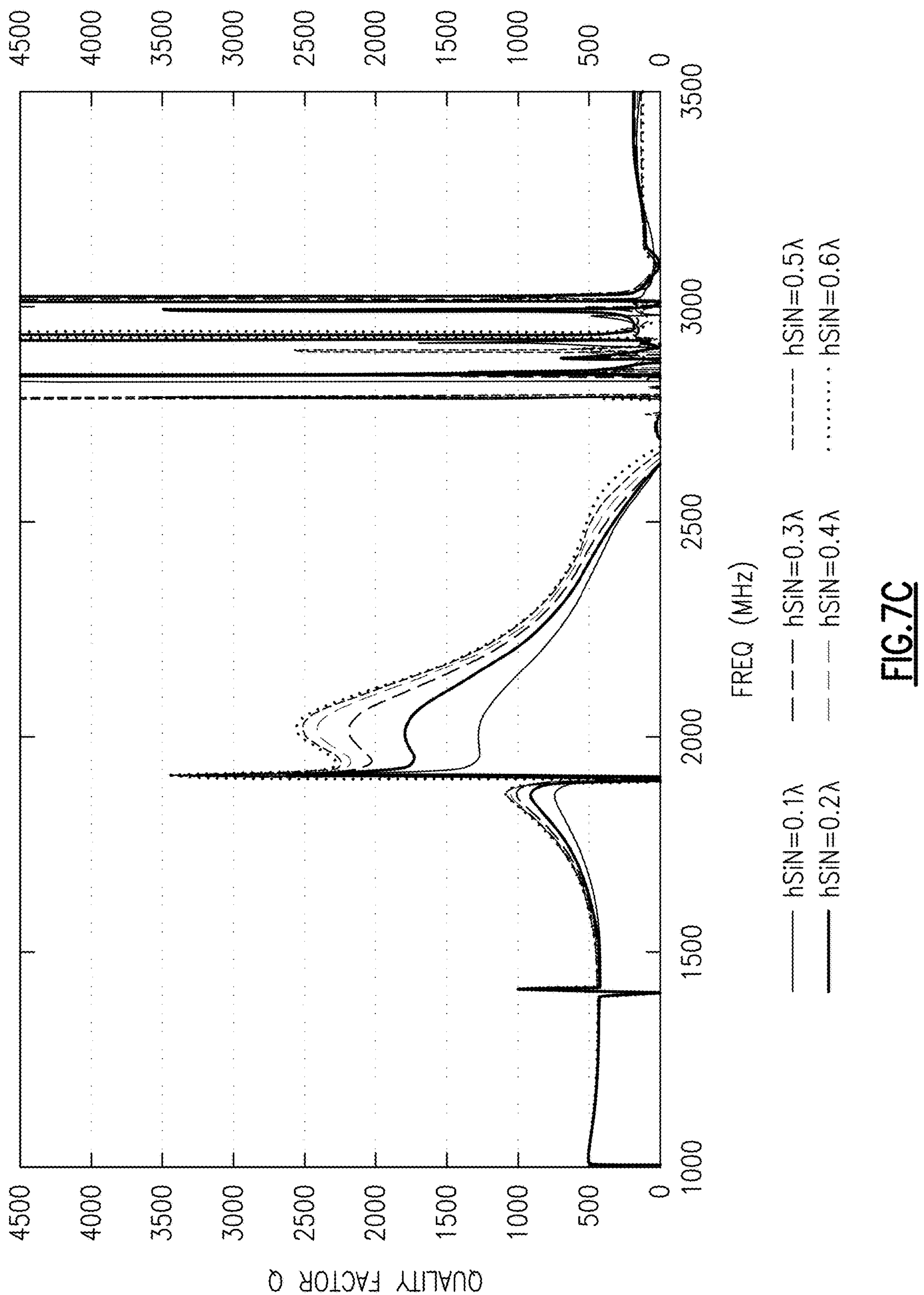
FIG. 7C illustrates results of a simulation of quality factor for acoustic wave devices having different thicknesses of a high velocity layer in their multilayer piezoelectric substrate structures.

Simulations were performed to evaluate the effect of thickness of the high velocity layer 54 ("hSiN") on admittance, real admittance, and quality factor in an example of an acoustic wave resonator having a multilayer piezoelectric substrate structure such as illustrated in FIG. 4. In the simulated resonator, the high velocity layer 54 was formed of SiN, the dielectric material layer 34 was a 0.2λ thick layer of $SiO_2$, and the layer 32 of piezoelectric material was a 0.2λ thick layer of lithium tantalate. These results of these simulations are shown in FIGS. 7A, 7B, and 7C, respectively. No remarkable difference was observed in the curves of admittance in FIG. 7A for the different thicknesses of the high velocity layer 54. In the curves for real admittance in FIG. 7B, the resonators with thicknesses of 0.1λ and 0.2λ of the high velocity layer 54 exhibited less desirable characteristics near the anti-resonant frequency than the other resonators. The quality factor at the anti-resonance frequency, however, was better (higher) when the thickness of the high velocity layer 54 was greater than 0.3λ, than when it was thinner than 0.3λ. Without wishing to be bound to a particular theory, it is believed that the thicker the high velocity layer 54, the more effective it was at preventing acoustic waves generated by the IDT electrodes from reaching the carrier substrate and reflecting and thereby reducing the quality factor exhibited by the resonators.

Figure 8A:
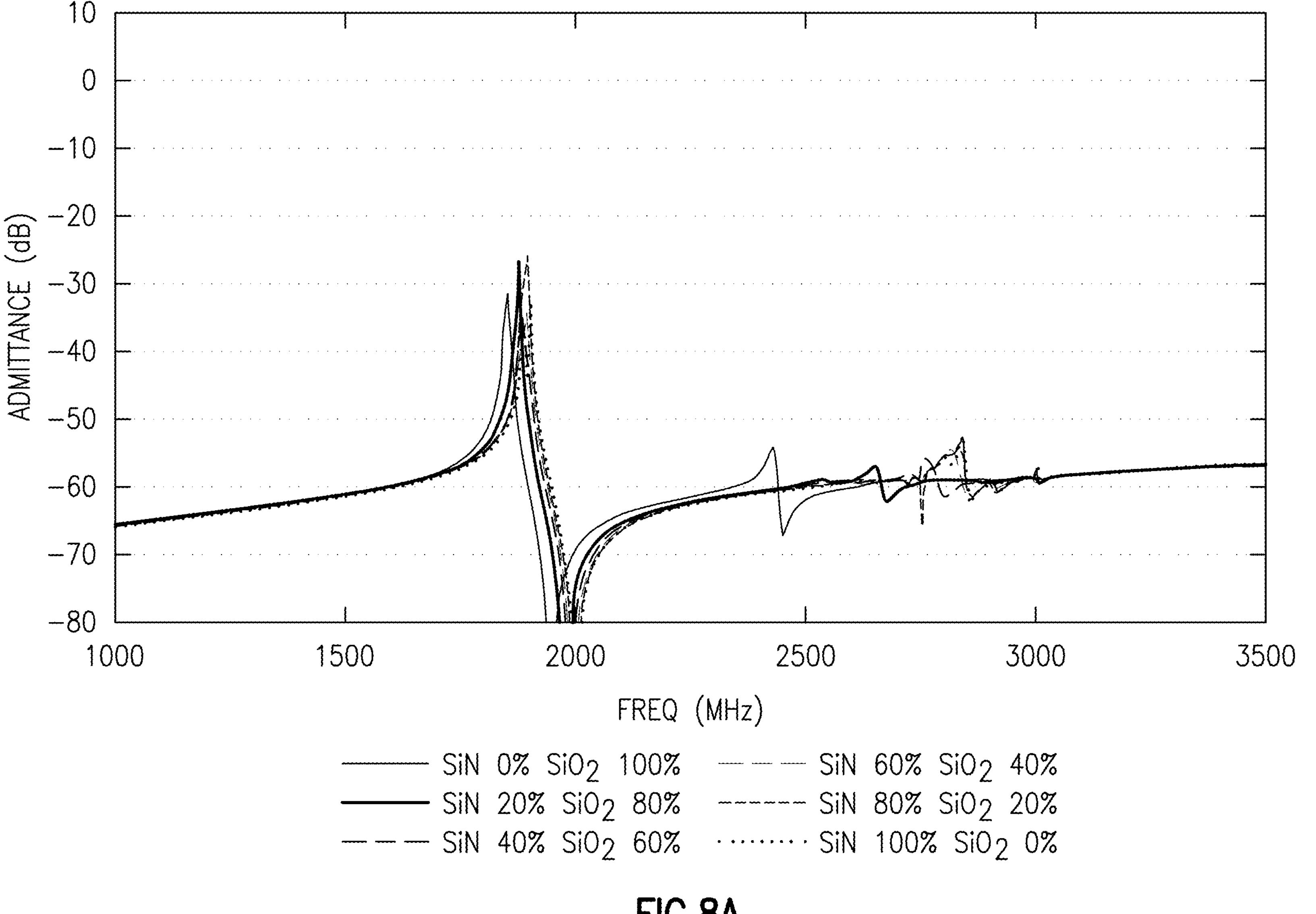
FIG. 8A illustrates results of a simulation of admittance for acoustic wave devices having different compositions of a high velocity layer in their multilayer piezoelectric substrate structures.
Figure 8B:
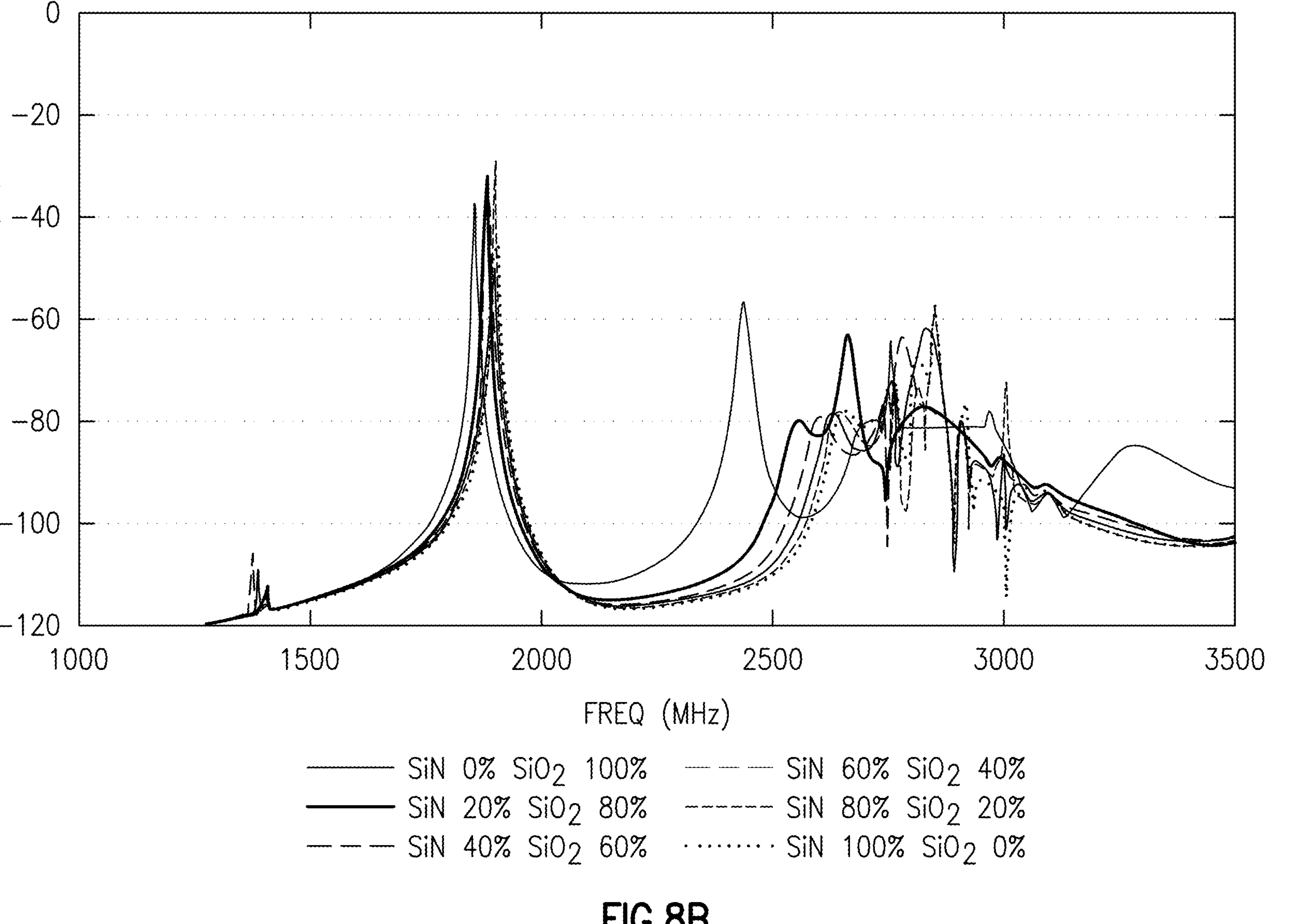
FIG. 8B illustrates results of a simulation of real admittance for acoustic wave devices having different compositions of a high velocity layer in their multilayer piezoelectric substrate structures.
Figure 8C:
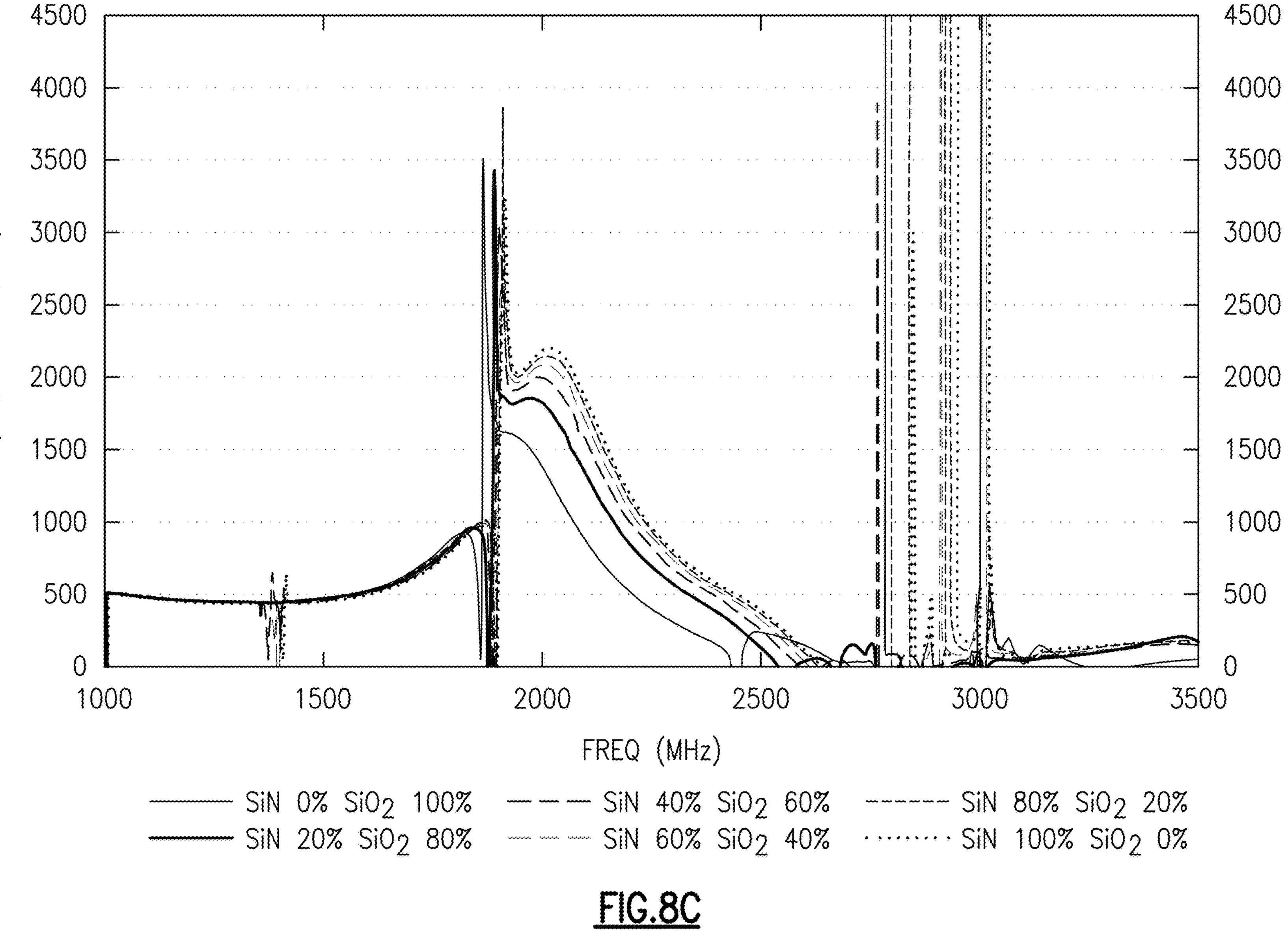
FIG. 8C illustrates results of a simulation of quality factor for acoustic wave devices having different compositions of a high velocity layer in their multilayer piezoelectric substrate structures.

Simulations were performed to evaluate the effect of composition of the high velocity layer 54 (relative amounts of SiN vs. $SiO_2$) on admittance, real admittance, and quality factor in an example of an acoustic wave resonator having a multilayer piezoelectric substrate structure such as illustrated in FIG. 4. In the simulated resonator, the high velocity layer 54 was formed of either SiN, $SiO_2$, or a mixture thereof including the atomic percentages indicated in the legends of FIGS. 8A-8C, the dielectric material layer 34 was a 0.2λ thick layer of $SiO_2$, and the layer 32 of piezoelectric material was a 0.2λ thick layer of lithium tantalate. These results of these simulations are shown in FIGS. 8A, 8B, and 8C, respectively. In the admittance curves in FIG. 8A the spurious response observed near 2500 MHz in the SiN 0% $SiO_2$ 100% example moved upward in frequency with increasing SiN amount until the amount of SiN reached 50% at which point increasing the SiN amount further did not result in the location of this spurious response moving further upward in frequency. In FIG. 8B, the SiN 0% $SiO_2$ 100% example exhibited the worst real admittance at the anti-resonant frequency. The real admittance characteristics improved with increasing SiN amount with little further improvement for SiN concentrations of over 50%. The quality factor at the anti-resonance frequency was better (higher) when the composition of the high velocity layer 54 was 60 at % SiN or greater than when the high velocity layer included a higher percentage of silicon dioxide. Without wishing to be bound to a particular theory, it is believed that increased amounts of silicon nitride as opposed to silicon dioxide in the high velocity layer 54, the higher the acoustic velocity difference between the dielectric material layer 34 and the high velocity layer 54, and the more effective the high velocity layer 54 was at preventing acoustic waves generated by the IDT electrodes from reaching the carrier substrate and reflecting and thereby reducing the quality factor exhibited by the resonators.

In alternate embodiments, in an acoustic wave resonator having a multilayer piezoelectric substrate structure such as illustrated in FIG. 4, the carrier substrate 52 may be formed of a material other than spinel. In some embodiments, the carrier substrate 52 could be formed of the same material as the material of the high velocity layer 54, for example, one or more of silicon nitride (SiN), silicon oxy-nitride (SiON), aluminum nitride (AlN), alumina ($Al_2O_3$), sapphire, quartz, or another material exhibiting a higher acoustic velocity than the acoustic velocity exhibited by the material of the dielectric material layer 34. In embodiments in which the carrier substrate 52 and high velocity layer 54 are formed of the same material, this is effectively the same as there being no separate carrier substrate 52. Rather, a thickened high velocity layer 54 could serve each of the function of confining acoustic energy primarily in the high velocity layer 54, dielectric material layer 34, and layer 32 of piezoelectric material, and the functions of providing mechanical support and thermal dissipation for the resonator structure.

Figure 9:
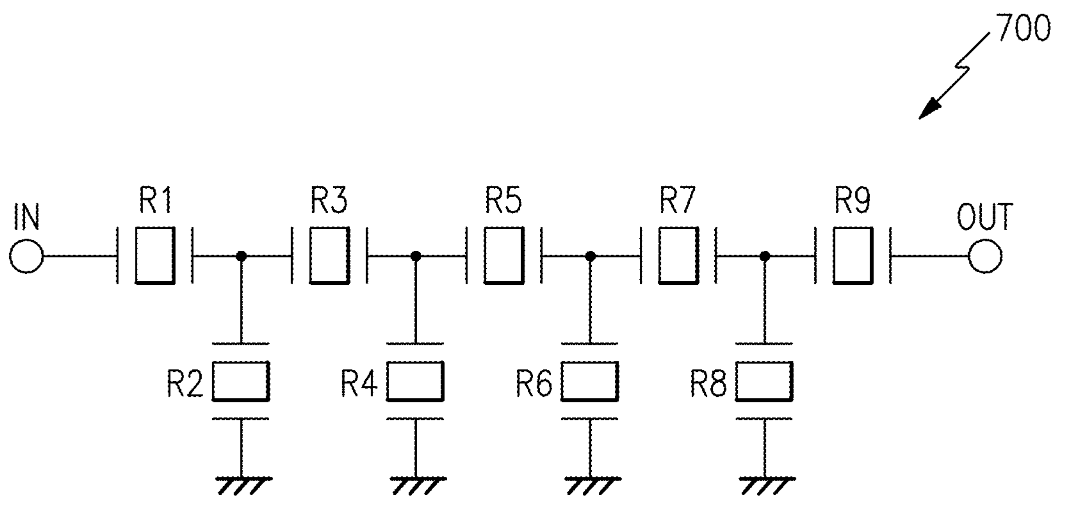
FIG. 9 is a schematic diagram of a radio frequency ladder filter.

In some embodiments, multiple SAW resonators as disclosed herein may be combined into a filter, for example, an RF ladder filter schematically illustrated in FIG. 9 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include SAW devices or resonators, for example, duplexers, baluns, etc., may also be formed including examples of SAW resonators as disclosed herein.

Figure 10:
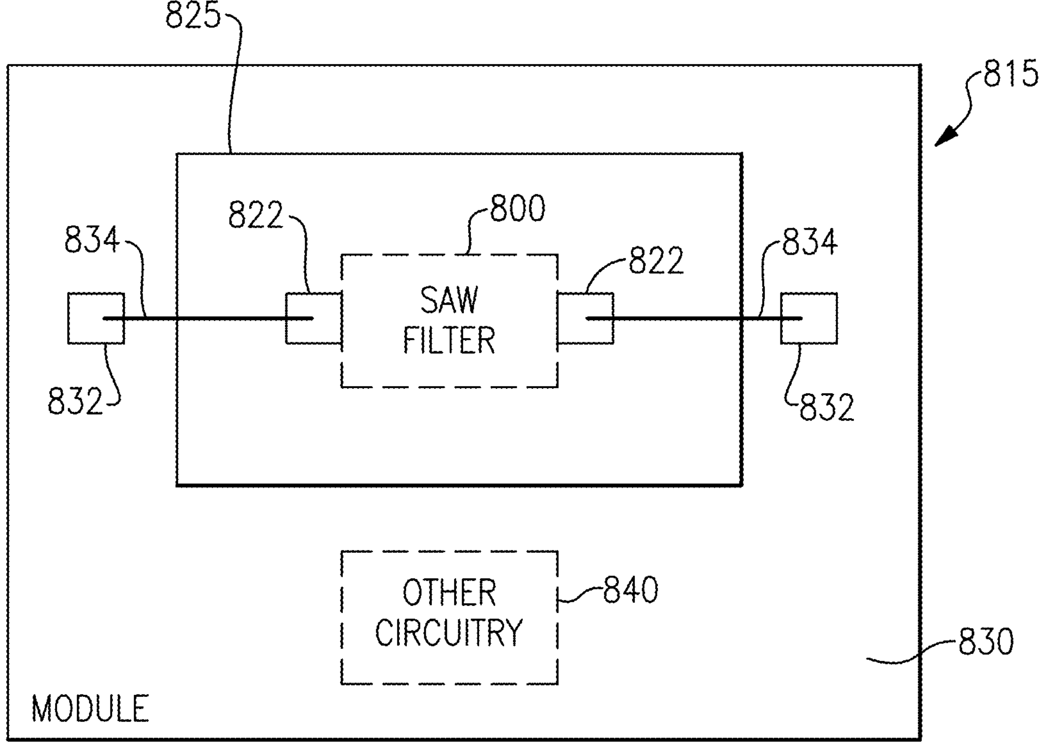
FIG. 10 is a block diagram of one example of a filter module that can include one or more acoustic wave elements according to aspects of the present disclosure.
Figure 11:
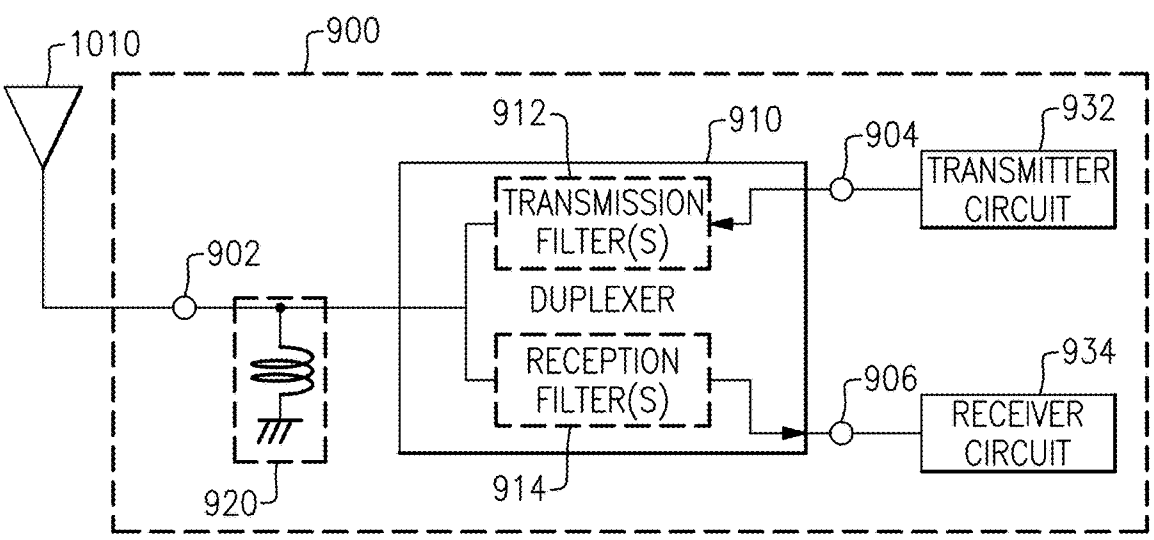
FIG. 11 is a block diagram of one example of a front-end module that can include one or more filter modules according to aspects of the present disclosure.
Figure 12:
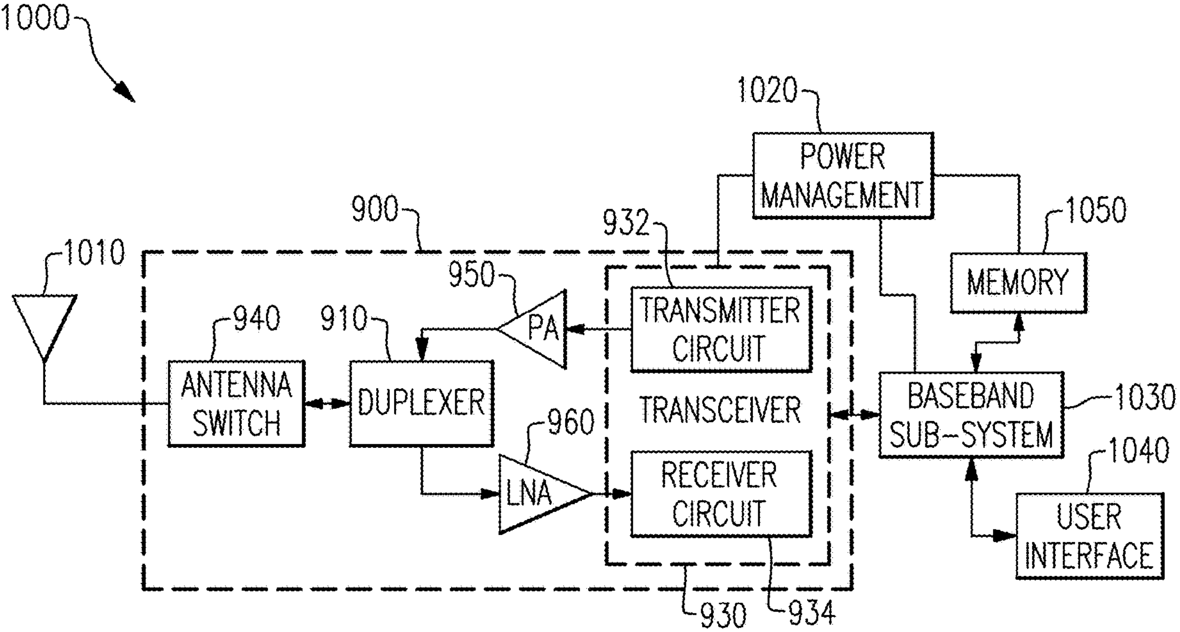
FIG. 12 is a block diagram of one example of a wireless device including the front-end module of FIG. 11.

Examples of the SAW devices, e.g., SAW resonators discussed herein can be implemented in a variety of packaged modules. Some example packaged modules will now be discussed in which any suitable principles and advantages of the SAW devices discussed herein can be implemented. FIGS. 10, 11, and 12 are schematic block diagrams of illustrative packaged modules and devices according to certain embodiments.

As discussed above, surface acoustic wave resonators can be used in surface acoustic wave (SAW) RF filters. In turn, a SAW RF filter using one or more surface acoustic wave elements may be incorporated into and packaged as a module that may ultimately be used in an electronic device, such as a wireless communications device, for example. FIG. 10 is a block diagram illustrating one example of a module 315 including a SAW filter 300. The SAW filter 300 may be implemented on one or more die(s) 325 including one or more connection pads 322. For example, the SAW filter 300 may include a connection pad 322 that corresponds to an input contact for the SAW filter and another connection pad 322 that corresponds to an output contact for the SAW filter. The packaged module 315 includes a packaging substrate 330 that is configured to receive a plurality of components, including the die 325. A plurality of connection pads 332 can be disposed on the packaging substrate 330, and the various connection pads 322 of the SAW filter die 325 can be connected to the connection pads 332 on the packaging substrate 330 via electrical connectors 334, which can be solder bumps or wirebonds, for example, to allow for passing of various signals to and from the SAW filter 300. The module 315 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 315 can also include one or more packaging structures to, for example, provide protection and facilitate easier handling of the module 315. Such a packaging structure can include an overmold formed over the packaging substrate 330 and dimensioned to substantially encapsulate the various circuits and components thereon.

Various examples and embodiments of the SAW filter 300 can be used in a wide variety of electronic devices. For example, the SAW filter 300 can be used in an antenna duplexer, which itself can be incorporated into a variety of electronic devices, such as RF front-end modules and communication devices.

Referring to FIG. 11, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter (s) are different from the passband(s) of the reception filters. Examples of the SAW filter 300 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 11, however, in other embodiments these components may be integrated into a common transceiver circuit or module. As will be appreciated by those skilled in the art, the front-end module 400 may include other components that are not illustrated in FIG. 11 including, but not limited to, switches, electromagnetic couplers, amplifiers, processors, and the like.

FIG. 12 is a block diagram of one example of a wireless device 500 including the antenna duplexer 410 shown in FIG. 11. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 11. The front-end module 400 includes the duplexer 410, as discussed above. In the example shown in FIG. 12 the front-end module 400 further includes an antenna switch 440, which can be configured to switch between different frequency bands or modes, such as transmit and receive modes, for example. In the example illustrated in FIG. 12, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 12.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 12, the front-end module 400 may further include a low noise amplifier module 460, which amplifies received signals from the antenna 510 and provides the amplified signals to the receiver circuit 434 of the transceiver 430.

The wireless device 500 of FIG. 12 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHZ.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A multilayer piezoelectric substrate for a surface acoustic wave resonator, the multilayer piezoelectric substrate comprising:

a carrier substrate having an upper surface;

a high acoustic velocity dielectric layer having a lower surface disposed on the upper surface of the carrier substrate and an upper surface to reflect acoustic energy generated by the surface acoustic wave resonator away from the carrier substrate, the high acoustic velocity dielectric layer comprising silicon nitride and silicon dioxide;

a low acoustic velocity dielectric layer having a lower surface disposed on the upper surface of the high acoustic velocity dielectric layer and an upper surface, the low acoustic velocity dielectric layer exhibiting a lower acoustic velocity than an acoustic velocity of the high acoustic velocity dielectric layer; and a layer of lithium tantalate having a lower surface disposed on the upper surface of the low acoustic velocity dielectric layer.

2. The multilayer piezoelectric substrate of claim 1 wherein the carrier substrate comprises a polycrystalline material.

3. The multilayer piezoelectric substrate of claim 2 wherein the carrier substrate comprises $Mg_2AlO_4$.

4. The multilayer piezoelectric substrate of claim 1 wherein the high acoustic velocity dielectric layer comprises a greater amount of silicon nitride than silicon dioxide.

5. The multilayer piezoelectric substrate of claim 1 wherein the low acoustic velocity dielectric layer comprises silicon dioxide.

6. The multilayer piezoelectric substrate of claim 1 wherein the high acoustic velocity dielectric layer is thicker than the low acoustic velocity dielectric layer.

7. The multilayer piezoelectric substrate of claim 1 wherein the high acoustic velocity dielectric layer is thicker than the layer of lithium tantalate.

8. The multilayer piezoelectric substrate of claim 7 wherein the high acoustic velocity dielectric layer has a thickness of at least $0.3\lambda$, wherein $\lambda$ is a wavelength of a main acoustic wave generated by the surface acoustic wave resonator.

9. The multilayer piezoelectric substrate of claim 1 wherein the high acoustic velocity dielectric layer is thicker than a combined thickness of the low acoustic velocity dielectric layer and the layer of lithium tantalate.

10. The multilayer piezoelectric substrate of claim 1 wherein the carrier substrate comprises a same material as the high acoustic velocity dielectric layer.

11. The multilayer piezoelectric substrate of claim 10 wherein the carrier substrate consists of the same material as the high acoustic velocity dielectric layer.

12. A surface acoustic wave resonator including the multilayer piezoelectric substrate of claim 1.

13. A filter including the surface acoustic wave resonator of claim 12.

14. A radio frequency device module including the filter of claim 13.

15. A radio frequency device including the radio frequency device module of claim 14.

16. A method of forming a surface acoustic wave resonator, the method comprising:

providing a carrier substrate having an upper surface;

forming a high acoustic velocity dielectric layer having a lower surface on the upper surface of the carrier substrate, the high acoustic velocity dielectric layer comprising silicon nitride and silicon dioxide;

forming a low acoustic velocity dielectric layer having on an upper surface of the high acoustic velocity dielectric layer, the low acoustic velocity dielectric layer exhibiting a lower acoustic velocity than an acoustic velocity of the high acoustic velocity dielectric layer;

forming a layer of lithium tantalate on an upper surface of the low acoustic velocity dielectric layer; and forming interdigital transducer electrodes on an upper surface of the layer of lithium tantalate.

17. The method of claim 16 further comprising forming a radio frequency filter including the surface acoustic wave resonator of claim 16.

18. The method of claim 17 further comprising forming a radio frequency device module including the radio frequency filter of claim 17.

19. The method of claim 18 further comprising forming a radio frequency electronic device including the radio frequency device module of claim 18.

* * * * *